May 2, 1967 W. ENGBERT 3,317,359

METHOD OF FORMING A TRANSISTOR BY DIFFUSING RECOMBINATION CENTERS AND DEVICE PRODUCED THEREBY

Filed May 5, 1965

INVENTOR
Wilhelm Engbert

BY George H. Spencer

ATTORNEY

United States Patent Office 3,317,359

Patented May 2, 1967

3,317,359

METHOD OF FORMING A TRANSISTOR BY DIFFUSING RECOMBINATION CENTERS AND DEVICE PRODUCED THEREBY

Wilhelm Engbert, Ulm (Danube), Germany, assignor to Telefunken A.G. Patentabteilung, Berlin, Germany Filed May 5, 1965, Ser. No. 458,810
Claims priority, application Germany, Apr. 8, 1959, T 16,518
5 Claims. (Cl. 148—186)

This application is a continuation-in-part of my copending application Ser. No. 19,762, filed Apr. 4, 1960, now abandoned.

The present invention relates to semiconductor devices, and, more particularly, to transistors.

The proper utilization of semiconductor circuit elements presupposes that there exist manufacturing processes by which the elements can have any desired electrical characteristics imparted to them. One factor which often affects the characteristics of the semiconductor elements is the geometrical configuration of the element. Other ways in which the electrical characteristics of the semiconductor elements can be influenced involves doping the semiconductor crystal in order to meet the particular requirements, the inclusion, in the crystal, of different conductive layers, and the provision of a conductive gradient in the crystal.

The characteristics of a semiconductor element can, however, also be improved in certain respects by precisely locating recombination centers, the same involving the principle which may be referred to as the "recombination variation," and the present invention, which relates to a transistor, resides in the fact that the base zone contains, besides its doping, recombination centers whose density decreases from one of the zones which is next to the base zone and which is of a conductivity type opposite to the conductivity type of the base zone to the other zone which is next to the base zone and which is of such opposite conductivity type.

If a recombination layer is introduced into the base zone near the emitter barrier layer or junction, it will be the $\beta$-value of the transistor which is affected, while in the other case, i.e., in the case where the recombination layer is introduced near the collector barrier layer, the transistor will be prevented from assuming a so-called overcontrolled condition, this being a condition which is generally to be avoid, particularly in the case of power transistors.

The current amplification factor or gain of the transistor when the same is operated in common emitter configuration, generally referred to as $\beta$, is, in known transistors, determined primarily by three factors, namely, the lifetime of the charge carrier in the semiconductor material of the base zone, the recombination speed at the boundary of the crystal, and the thickness of the base zone. The thinner the base zone, the greater will be the $\beta$-value; the shorter the lifetime of the charge carriers in the base zone, the lower will be the $\beta$-value. In the case of drift transistor, which, as is well known, have good high-frequency characteristics, there will be the additional effect that, due to the heavy doping at the boundary of the semiconductor body in the region of the emitter, the influence of the boundary recombination is suppressed. In the case of high-frequency transistors having drifted base zones, the $\beta$-value will therefore frequently be over 200.

One thing which has to be borne in mind, however, is that such high gain is not always desirable, when the transistor is connected in common emitter configuration. This is particularly so when the transistor, connected in common-emitter configuration, is to be used as the amplifier element of a wide-band amplifier. The reason for this is that the $\beta$-cut-off frequency $f_\beta$, in common emitter configuration, is determined by the value $f_a/\beta$, i.e., the ratio of the $\alpha$-cut-off frequency $f_a$ to the current gain $\beta$ in common emitter configuration. This means that the higher the $\beta$-value, the lower will be frequency $f_a$. For the case of broad-band amplification, therefore, it is desirable that the $\beta$-value be kept within certain limits, e.g., $20 \leq \beta \leq 50$.

Conventionally, the low $\beta$-values are obtained by increasing the width of the base or by shortening the lifetimes of the charge carriers trough the use of suitable additives. If, however, the base zone is widened, the $\alpha$-cut-off frequency is thereby reduced, and if additives are introduced for the purpose of shortening the lifetime in the crystal material, this brings with it the drawback that, with the decrease in the lifetime of the charge carriers, the $I_{Co}$-current of the transistor increases proportionally. ($I_{Co}$ is the reverse current flowing from the collector zone to the base zone when the collector-base junction is reverse-biased, the current being measured when the emitter zone is not connected.) Since an increase of the $I_{Co}$-current is undesired for certain cases, and since the decrease of the $\alpha$-cut-off frequency is objectionable for other cases, neither of the above-described ways of keeping the $\beta$-value down can fairly be deemed to be acceptable, and it is, therefore, the primary object of the present invention to provide a way which allows the $\beta$-value to be kept small and which at the same time avoids the above-described drawbacks.

With the above object in view, the present invention resides, basically, in a transistor which has a doped base zone of one conductivity type, this base zone being interposed between emitter and collector zones of the opposite conductivity type, wherein the base zone, in addition to containing the doping, also contains recombination centers whose density decreases from one of the zones which is next to the base zone and which is of the conductivity type opposite to the conductivity type of the base zone, to the other zone which is next to the base zone and which is of such opposite conductivity type. That is to say, the density of recombination centers within the base zone decreases from emitter zone to collector zone or from collector zone to emitter zone.

The present invention also resides in a method of making a transistor having a base zone, which includes the step of diffusing recombination centers into this base zone.

Additional objects and advantages of the present invention will become apparent upon consideration of the following description when taken in conjunction with the accompanying drawings in which.

Figure 1:
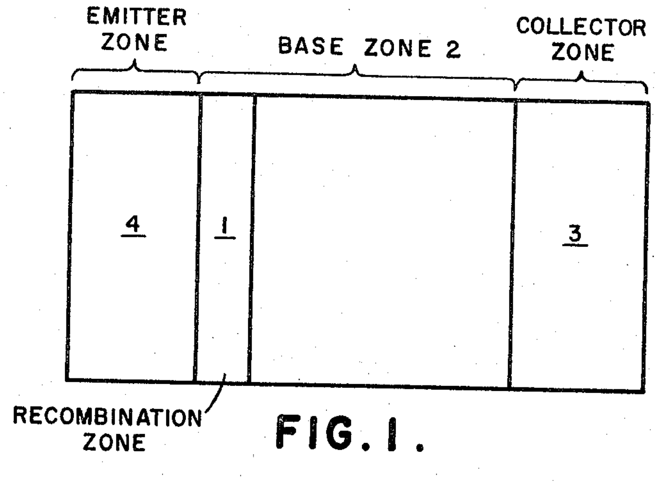
FIGURE 1 is a schematic block diagram of the various zones in a transistor according to one embodiment of the present invention.

Referring now to the drawings and first to FIGURE 1 thereof, the same shows a transistor in which a recombination zone 1 within the base zone 2 is near the emitter zone 4, the collector zone of the transistor being shown at 3. The base zone 2 is of one conductivity type and the emitter zone 4 and the collector zone 3 are of the opposite conductivity type. The transistor is one in which the $\beta$-value is reduced; in practice, the distance between the recombination zone 1 and the collector 3 will be made sufficiently large. The recombination zone 1 is provided by diffusing copper or nickel atoms from the emitter zone 4 into the base zone 2.

If, for example, the semiconductor block consists basically of germanium, the collector and emitter zones may be doped with $10^{17}$ per cm.$^3$ for supplying these zones with the majority charge carriers, while the base zone is doped with $10^{15}$ per cm.$^3$ for supplying this zone with the majority charge carriers of a polarity opposite to that of the charge carriers in the emitter and collector zones.

The recombination zone preferably comprises a zone doped with recombination atoms, such as copper or nickel atoms at a concentration of about $10^{15}$ per cm.$^3$. The concentration of these recombination atoms adjacent the collector zone will be only about $10^{12}$ per cm.$^3$. The recombination zone will be produced by permitting copper or nickel atoms to diffuse into the semiconductor block and, particularly, through the emitter zone into the base zone.

In practice, a wafer of germanium is used as starting material, doped throughout its extension with $10^{14}$ per cm.$^3$. Thereafter, arsenic is diffused into the germanium wafer in a limited area thereof. Thereafter, nickel is diffused into the wafer in the region wherein the arsenic has been diffused, but the diffusion of nickel is terminated before this material can diffuse throughout the entire region now doped with arsenic. Thus, there is produced an emitter zone terminating adjacent a zone containing only the doping material of the base zone and nickel or copper. This last-mentioned zone then becomes the recombination zone. Finally, the collector zone is produced remote from said emitter and recombination zones.

Figure 2:
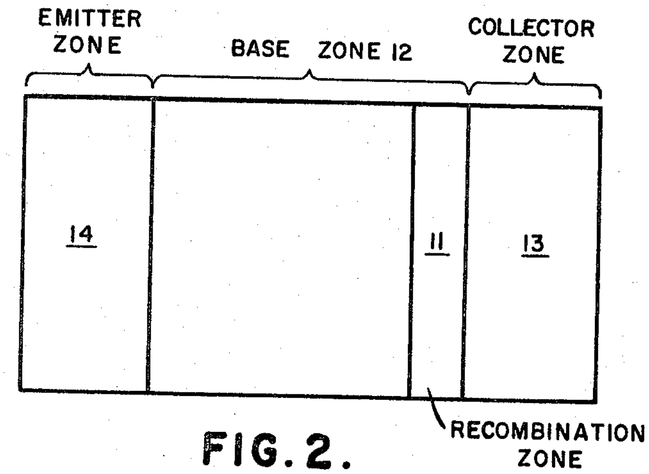
FIGURE 2 is a schematic block diagram of the various zones in a transistor according to another embodiment of the present invention.

The embodiment of FIGURE 2 differs from that of FIGURE 1 in that the recombination zone 11 of base zone 12 is near the collector zone 13, rather than near the emitter zone 14. The embodiment of FIGURE 2 is particularly suited for power transistors of which short switching times are required.

The different recombination center densities in the base zone can, for example, be produced by diffusing gold into the base zone. In the embodiment of FIGURE 2, the gold is vaporized and deposited onto the collector zone 13 at 300° C. and is diffused into the base zone 12, at a temperature of about 1000° C. throughout a diffusion time of about 20 minutes, the collector zone having a thickness of about 100 microns (1 micron$=10^{-3}$ mm.) and the thickness of the base zone being about 1 to 4 microns. If the transistor is a silicon transistor, the thickness of the base zone will, in general, be not even one micron.

It will thus be seen that the $\beta$-value is, in accordance with the present invention, reduced in that the recombination layer is provided in the base zone. This layer is, however, so thin as not to be in the vicinity of the collector zone, so that increase of the $I_{Co}$-current will be as small as possible. This undesired increase can be kept especially small if the base is low-ohmic in its recombination zone in the vicinity of the emitter as is, in fact, the case for example with drift transistors. The controlled emitter current must then flow through this thin layer, and the effect of the recombination layer will then be such that the desired $\beta$-value is obtained by the respective combination of the emitter current.

As explained above, the recombination zone can be provided, for example, by diffusing out of the emitter zone and into the semiconductor crystal atoms which bring about a shortening of the lifetime of the charge carriers, as, for example, copper or nickel atoms.

The present invention is particularly well suited for drift transistors. It is true that the presence of the recombination atoms in the vicinity of the emitter zone brings about the desired reduction of the $\beta$-value; however, the $I_{Co}$-current, which is proportional to the value $n_{min}/\sqrt{\tau}$, i.e., proportional to the ratio of the minority charge carrier density to the square root of the lifetime, can not be influenced because the recombination centers are in a region of the base zone which is heavily doped, i.e., a region which has but few minority carriers. A low concentration of minority carriers, however, results in a low electron-hole cancellation, i.e., the current $I_{Co}$ remains virtually unaffected by these recombination centers.

If the base zone of the transistor is not doped uniformly, for example, with arsenic from $10^{18}$ to $10^{14}$ per cm.$^3$, a recombination zone is most effective if it is located in the base zone in a region of maximum charge carrier density. In the case of a normal diffusion process, for example a diffusion process in which the current flows from the emitter to the collector, a so-called diffusion triangle is formed in the base zone, that is to say, the density of charge carriers is high at the emitter side and is virtually zero at the collector side. Thus, a recombination zone in such a transistor is most effective if it is located in the vicinity of the emitter zone, as shown in the embodiment of FIGURE 1. Were this zone at the edge of the collector, virtually no recombination effect would arise.

Nevertheless, there are cases in which the forward direction of the collector-base diode will be on the collector side, namely, when the transistor functions as an electronic switch and the collector voltage is made as low as possible, this being the quiescent voltage. Thus, due to the increase of the charge carrier density at the collector side, the diffusion triangle is transformed into a four-corner configuration having a slightly decreasing slope from the emitter toward the collector. This is so because the density of the charge carriers also increases markedly at the collector side. This overcontrolled state of the transistor is not desirable in the case of switching transistors because when the transistor is turned off, the increased amount of charge has to flow off before the collector current actually drops to zero; this is known as the storage time of the transistor. The overcontrolled state of the transistor can be avoided, however, if, as shown in FIGURE 2, a heavier recombination zone is provided ahead of the collector zone. The density of the charge carriers, on the collector side, can then not go beyond a given value, i.e., the overcontrol effect is, at the least, attenuated and the storage time of the transistor is reduced to a minimum.

It will also be seen from the above that the present invention resides in a method of making a transistor having a base zone, which includes the step of diffusing the recombination centers into this base zone. More particularly, a greater density of recombination centers is diffused into that part of the base zone which is near one of the two other zones, i.e., the emitter or collector zone, than into that part of the base zone which is near the other of the two zones.

The present invention should not be confused with the teaching of United States Patent No. 2,813,233, of Nov. 12, 1957, to William Shockley, which shows a transistor in which the charge carriers in the different zones have different lifetimes, as that patent does not show or suggest the teaching of providing the zones themselves with different recombination center densities; nor with the teaching of United States Patent No. 2,964,689, of Dec. 13, 1960, to Robert C. Buschert and Solomon L. Miller, which shows a transistor in which there is a change of the lifetime of the charge carriers in the base zone as well. This change in lifetime, however, does not, as is the case in a transistor according to the present invention, lie in the region of the transistor action but lies solely outside of this region.

It will be understood that the above description of the present invention is susceptible to various modifications, changes and adaptations, and the same are intended to be comprehended within the meaning and range of equivalents of the appended claims.

What is claimed is:

1. A transistor having a doped base zone of one conductivity type which is interposed between emitter and collector zones that are of the opposite conductivity type, said base zone further containing recombination centers, the density of said recombination centers decreasing from that portion of said base zone which is near one of said zones of said opposite conductivity type to that portion of said base zone which is near the other of said zones of said opposite conductivity type.

2. A transistor as defined in claim 1 wherein that portion of said base zone which is next to said emitter zone has a greater density of recombination centers than does the remainder of said base zone.

3. A transistor as defined in claim 1 wherein that portion of said base zone which is next to said collector zone has a greater density of recombination centers than does the remainder of said base zone.

4. In a method of making a transistor having a base zone, the step of diffusing recombination centers into said base zone from an emitter or collector zone adjacent said base zone.

5. In a method of making a transistor having a base zone of one conductivity type which is interposed between emitter and collector zones of the opposite conductivity type, the step of diffusing, from either of said two zones adjacent said base zone, a greater density of recombination centers into that part of the base zone which is near one of the two zones of said opposite conductivity type than into that part of the base zone which is near the other of said two zones of said opposite conductivity type.

References Cited by the Examiner

UNITED STATES PATENTS

| | | | |
|---|---|---|---|
| 2,811,653 | 10/1957 | Moore | 148—188 |
| 2,813,233 | 12/1957 | Shockley | 148—1.5 |
| 2,964,689 | 12/1960 | Buschert | 148—1.5 |
| 3,022,568 | 2/1962 | Nelson | 148—187 |
| 3,104,991 | 9/1963 | MacDonald | 148—187 |

HYLAND BIZOT, *Primary Examiner.*